US010166628B2

(12) United States Patent
Goto

(10) Patent No.: US 10,166,628 B2
(45) Date of Patent: Jan. 1, 2019

(54) THREE-DIMENSIONAL SHAPING APPARATUS, CONTROL METHOD THEREOF, AND CONTROL PROGRAM

(71) Applicant: TECHNOLOGY RESEARCH ASSOCIATION FOR FUTURE ADDITIVE MANUFACTURING, Tokyo (JP)

(72) Inventor: Kazuya Goto, Tokyo (JP)

(73) Assignee: TECHNOLOGY RESEARCH ASSOCIATION FOR FUTURE ADDITIVE MANUFACTURING, Tokyo (JP)

(*) Notice: Subject to any disclaimer, the term of this patent is extended or adjusted under 35 U.S.C. 154(b) by 237 days.

(21) Appl. No.: 14/763,144

(22) PCT Filed: Dec. 26, 2014

(86) PCT No.: PCT/JP2014/084653
§ 371 (c)(1),
(2) Date: Jul. 23, 2015

(87) PCT Pub. No.: WO2016/103493
PCT Pub. Date: Jun. 30, 2016

(65) Prior Publication Data
US 2016/0339536 A1 Nov. 24, 2016

(51) Int. Cl.
*B23K 15/02* (2006.01)
*B33Y 30/00* (2015.01)
(Continued)

(52) U.S. Cl.
CPC .......... *B23K 15/02* (2013.01); *B22F 3/1055* (2013.01); *B23K 15/0013* (2013.01);
(Continued)

(58) Field of Classification Search
CPC ...... B33Y 10/00; B33Y 50/02; H01J 37/3023; H01J 37/305; H01J 2237/3048;
(Continued)

(56) References Cited

U.S. PATENT DOCUMENTS 3,463,900 A * 8/1969 Downing ............ H01J 37/3045
219/121.13
3,789,185 A * 1/1974 Baldwin ............. H01J 37/3045
219/121.13
(Continued)

FOREIGN PATENT DOCUMENTS

JP 2003-531034 A 10/2003
JP 2004-078026 A * 3/2004
(Continued)

OTHER PUBLICATIONS

Machine translation of Japan Patent document No. 2004-078,026, Dec. 2017.*
(Continued)

Primary Examiner — Geoffrey S Evans
(74) Attorney, Agent, or Firm — Ladas & Parry LLP

(57) ABSTRACT

Even a region where powder is melted is scanned by an electron beam at the highest speed. A three-dimensional shaping apparatus includes an electron gun that generates an electron beam, at least one first deflector that deflects the electron beam one-dimensionally or two-dimensionally, at least one lens that is provided between the electron gun and the first deflector and focuses the electron beam, and a second deflector that is provided between the electron gun and the first deflector and deflects the electron beam one-dimensionally or two-dimensionally.

8 Claims, 12 Drawing Sheets

(51) Int. Cl.
*B33Y 50/02* (2015.01)
*B22F 3/105* (2006.01)
*B23K 15/00* (2006.01)
*H01J 37/302* (2006.01)
*H01J 37/305* (2006.01)

(52) U.S. Cl.
CPC .......... *B23K 15/0086* (2013.01); *B33Y 30/00* (2014.12); *B33Y 50/02* (2014.12); *H01J 37/305* (2013.01); *H01J 37/3023* (2013.01); *B22F 2003/1056* (2013.01); *B22F 2003/1057* (2013.01); *H01J 2237/30483* (2013.01); *H01J 2237/3128* (2013.01); *Y02P 10/295* (2015.11)

(58) Field of Classification Search
CPC ............ H01J 2237/3128; B22F 3/1055; B23K 15/0013; B23K 15/0086; B23K 15/02
See application file for complete search history.

(56) References Cited

U.S. PATENT DOCUMENTS

| | | | | |
|---|---|---|---|---|
| 4,066,863 A | * | 1/1978 | Doran | H01J 37/153 219/121.26 |
| 4,591,688 A | * | 5/1986 | Koch | B23K 15/02 219/121.29 |
| 4,914,304 A | * | 4/1990 | Koyama | B82Y 10/00 219/121.25 |
| 4,944,817 A | * | 7/1990 | Bourell | B22F 3/004 156/272.8 |
| 2006/0226128 A1 | * | 10/2006 | Otsuka | B23K 26/0884 219/121.64 |
| 2007/0075262 A1 | * | 4/2007 | Winkler | H01J 37/1477 250/398 |
| 2008/0143278 A1 | * | 6/2008 | Zosel | B23K 15/0026 315/403 |
| 2012/0138814 A1 | * | 6/2012 | Preikszas | H01J 37/1474 250/396 R |
| 2013/0055568 A1 | | 3/2013 | Dusel et al. | |
| 2013/0214172 A1 | * | 8/2013 | Touya | H01J 37/09 250/396 R |
| 2014/0242400 A1 | * | 8/2014 | Hoebel | B23K 26/0093 428/457 |
| 2014/0314964 A1 | | 10/2014 | Ackelid | |
| 2014/0348691 A1 | | 11/2014 | Ljungblad et al. | |
| 2015/0283613 A1 | * | 10/2015 | Backlund | B33Y 10/00 419/53 |
| 2016/0271884 A1 | * | 9/2016 | Herzog | B22F 3/1055 |
| 2018/0015565 A1 | * | 1/2018 | Goto | B33Y 30/00 |
| 2018/0065179 A1 | * | 3/2018 | Goto | B22F 3/105 |
| 2018/0166251 A1 | * | 6/2018 | Yuan | B29C 64/153 |

FOREIGN PATENT DOCUMENTS

| | | |
|---|---|---|
| JP | 2004-78026 A | 3/2004 |
| JP | 2007-67192 A | 3/2007 |
| JP | 2007-157748 A | 6/2007 |
| JP | 2010-255057 A | 11/2010 |
| JP | 2010-261072 A | 11/2010 |
| WO | 01/81031 A1 | 11/2001 |

OTHER PUBLICATIONS

Espacenet English abstract of JP 2003-531034 A.
J-PlatPat English abstract of JP 2007-67192 A.
J-PlatPat English abstract of JP 2010-261072 A.
J-PlatPat English abstract of JP 2010-255057 A.
J-PlatPat English abstract of JP 2007-157748 A.
Supplementary European Search Report dated Oct. 11, 2016 for Application No. EP 14 87 9254.
Patent Abstracts of Japan English abstract of JP 2004-78026 A.

\* cited by examiner

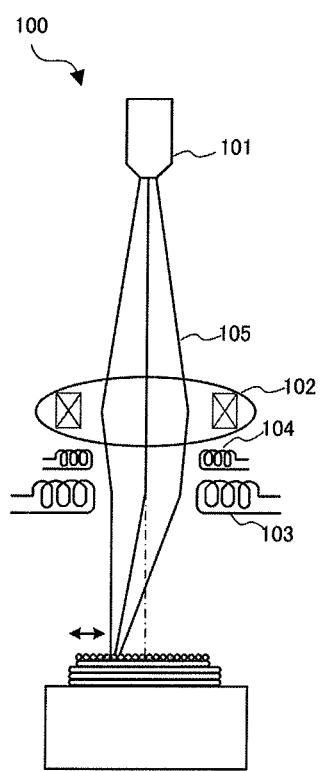
F I G. 1

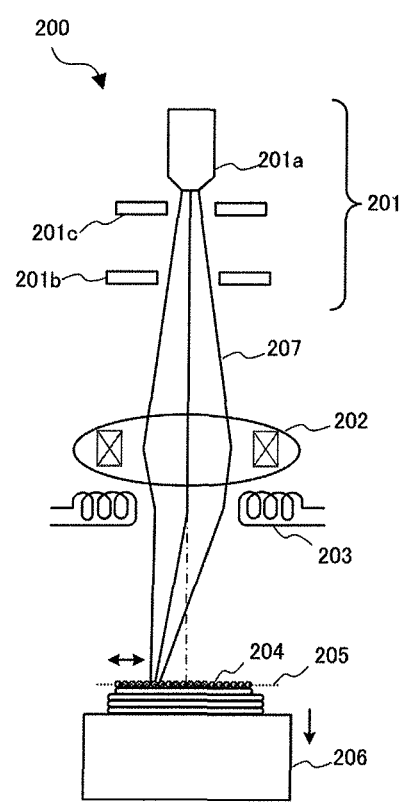
F I G. 2

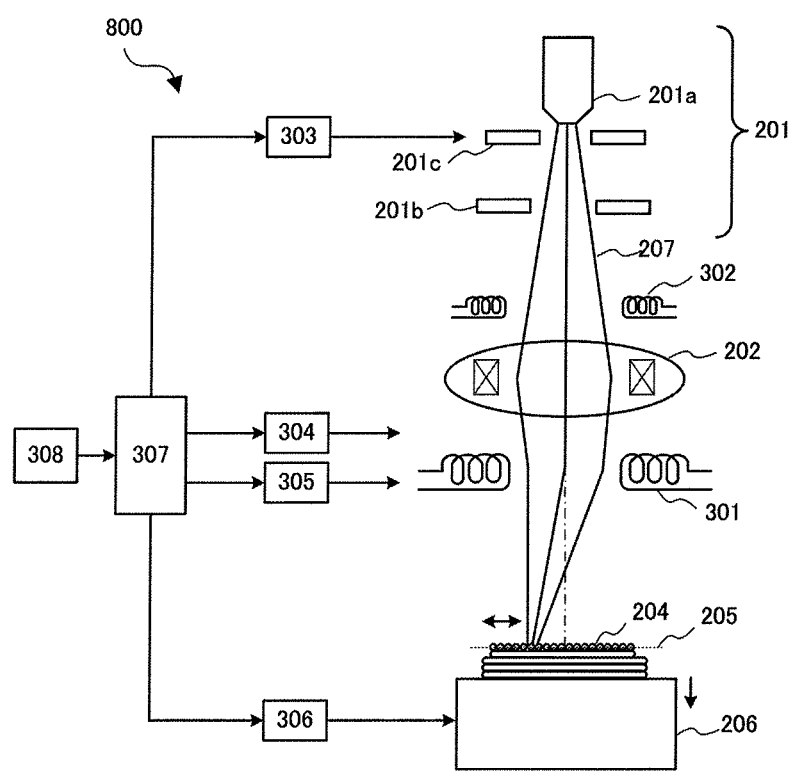
F I G. 8

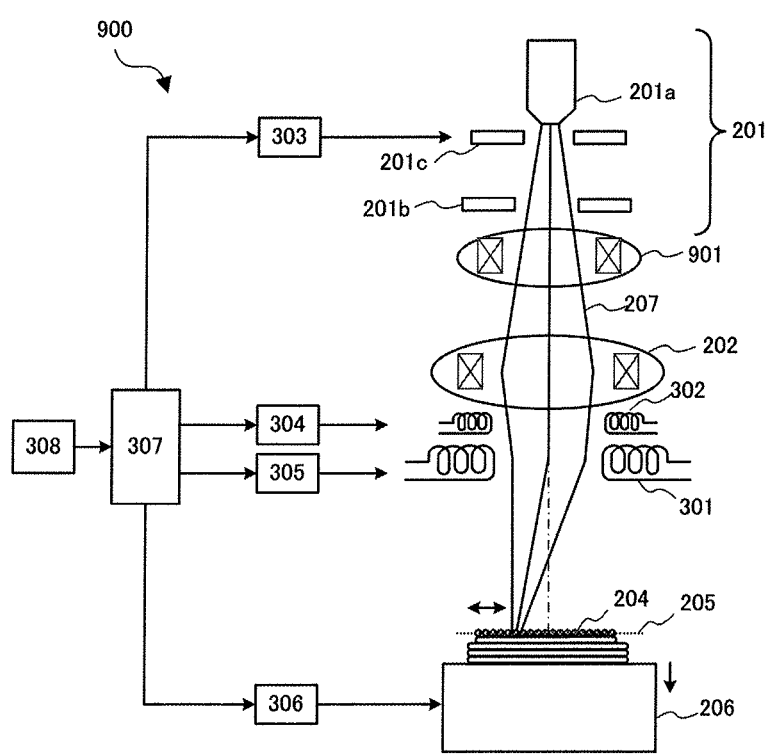
F I G. 9

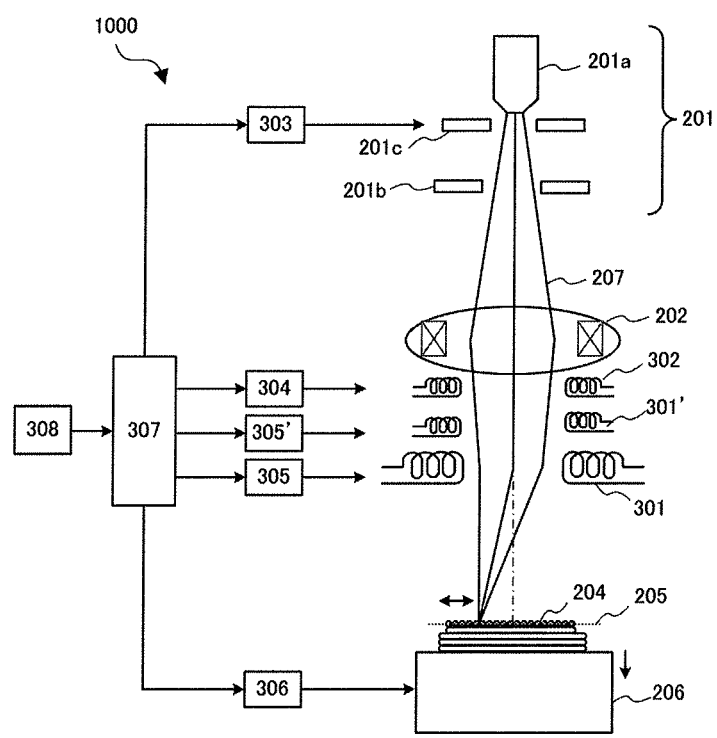
F I G. 10

THREE-DIMENSIONAL SHAPING APPARATUS, CONTROL METHOD THEREOF, AND CONTROL PROGRAM

TECHNICAL FIELD

The present invention relates to a three-dimensional shaping apparatus, a control method thereof, and a control program.

BACKGROUND ART

In the above technical field, patent literature 1 discloses a three-dimensional product manufacturing apparatus in which an electron beam scans powder.

CITATION LIST

Patent Literature

Patent literature 1: Japanese PCT National Publication No. 2003-531034
Patent literature 2: Japanese Patent Laid-Open No. 2007-67192

SUMMARY OF THE INVENTION

Technical Problem

In the technique described in the above literature, however, it is impossible for the electron beam to perform scans at a higher speed in the regions where powder is melted.

The present invention enables one to provide a technique of solving the above-described problem.

Solution to Problem

One aspect of the present invention provides a three-dimensional shaping apparatus comprising:
an electron gun that generates an electron beam;
at least one first deflector that deflects the electron beam one-dimensionally or two-dimensionally;
at least one lens that is provided between the electron gun and the first deflector, and focuses the electron beam; and
a second deflector that is provided between the electron gun and the first deflector, and deflects the electron beam one-dimensionally or two-dimensionally.

Another aspect of the present invention provides a control method of a three-dimensional shaping apparatus, comprising:
generating an electron beam;
deflecting the electron beam one-dimensionally or two-dimensionally when the electron beam scans a region where powder is melted; and
further deflecting the electron beam one-dimensionally or two-dimensionally in a direction different from the deflection direction in which the electron beam is deflected to scan the aforementioned region, when the electron beam scans a region where the powder is not melted.

Still other aspect of the present invention provides a control program of a three-dimensional shaping apparatus for causing a computer to execute a method, comprising:
generating an electron beam;
deflecting the electron beam one-dimensionally or two-dimensionally when the electron beam scans a region where powder is melted; and
further deflecting the electron beam one-dimensionally or two-dimensionally in a direction different from the deflection direction in which the electron beam is deflected to scan the aforementioned region, when the electron beam scans a region where the powder is not melted.

Advantageous Effects of Invention

The present invention makes it possible for the electron beam to perform scans at a higher speed even in the regions where powder is melted.

BRIEF DESCRIPTION OF DRAWINGS

FIG. 1 is a view showing the arrangement of a three-dimensional shaping apparatus according to the first embodiment of the present invention;
FIG. 2 is a view showing the arrangement of a three-dimensional shaping apparatus according to the background art of the second embodiment of the present invention;
FIG. 8 is a view showing the arrangement of a three-dimensional shaping apparatus according to the fourth embodiment of the present invention;
FIG. 9 is a view showing the arrangement of a three-dimensional shaping apparatus according to the fifth embodiment of the present invention;
FIG. 10 is a view showing the arrangement of a three-dimensional shaping apparatus according to the sixth embodiment of the present invention.

DESCRIPTION OF THE EMBODIMENTS

Figure 3:
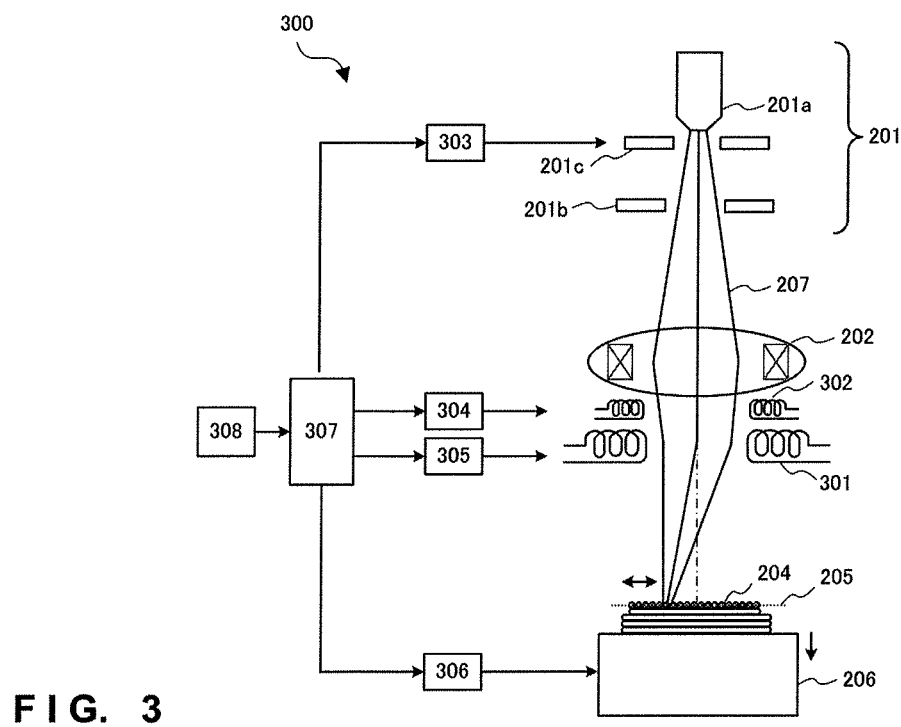
FIG. 3 is a view showing the arrangement of a three-dimensional shaping apparatus according to the second embodiment of the present invention.

Preferred embodiments of the present invention will now be described in detail with reference to the drawings. It should be noted that the relative arrangement of the components, the numerical expressions and numerical values set forth in these embodiments do not limit the scope of the present invention unless it is specifically stated otherwise.

[First Embodiment]

A three-dimensional shaping apparatus according to the first embodiment of the present invention will be described with reference to FIG. 1. The three-dimensional shaping apparatus 100 is an apparatus which shapes a three-dimensional structure by laminating metal powder layers melted and solidified with an electron beam.

As shown in FIG. 1, the three-dimensional shaping apparatus 100 includes an electron gun 101, a first deflector 103, a lens 102, and a second deflector 104. The electron gun 101 generates an electron beam 105. The first deflector 103 deflects the electron beam 105 two-dimensionally. The lens 102 is provided between the electron gun 101 and the first deflector 103, and focuses the electron beam 105. The second deflector 104 is provided between the electron gun 101 and the first deflector 103, and deflects the electron beam 105 two-dimensionally.

According to this embodiment, it is possible for the electron beam to perform scans at the highest speed even in the regions where powder is melted.

[Second Embodiment]

A three-dimensional shaping apparatus according to the second embodiment of the present invention will be described with reference to FIGS. 2 to 7.

(Background Art)

FIG. 2 is a view for explaining the arrangement of a three-dimensional shaping apparatus according to the background art of this embodiment. The three-dimensional shaping apparatus 200 includes an electron gun 201, a lens 202, a deflector 203, and a Z-axis stage 206. The electron gun 201 includes a cathode 201a, an anode 201b, and a grid 201c.

The electron gun 201 is a thermionic-emission electron gun, the lens 202 is an electromagnetic lens, and the deflector 203 is an electromagnetic deflector. The deflector 203 includes an X-direction deflection coil and a Y-direction deflection coil. The three-dimensional shaping apparatus 200 also includes a mechanism (not shown) for spreading metal powder 204 over the shaping surface 205. The Z-axis stage 206 sets the position of the metal powder 204 at the height of the shaping surface 205.

The three-dimensional shaping apparatus 200 shapes a three-dimensional structure according to the following procedure. The three-dimensional shaping apparatus 200 spreads the metal powder 204 over the shaping surface 205. The three-dimensional shaping apparatus 200 causes the lens 202 to focus an electron beam 207 emitted by the electron gun 201 so that the diameter of the electron beam 207 becomes smallest on the shaping surface 205. The three-dimensional shaping apparatus 200 causes the electron beam 207 focused by the lens 202 to be incident on a predetermined region on the shaping surface 205 by deflecting the electron beam 207 two-dimensionally (in the X and Y directions) using the deflector 203.

The three-dimensional shaping apparatus 200 heats the metal powder 204 with the incident electron beam 207. More specifically, the three-dimensional shaping apparatus 200 preheats (preliminarily sinters) the metal powder 204, and then melts it. Here, the deflector 203 controls the deflection direction of the electron beam 207 based on data representing the shape of a desired three-dimensional structure. That is, the three-dimensional shaping apparatus 200 scans the predetermined region on the shaping surface 205 with the electron beam 207 based on the data.

In the above-described steps, the melted metal powder 204 is cooled and solidified, resulting in a thin metal layer forming part of the desired three-dimensional structure. This metal layer is no longer powder, but a continuous structure. Therefore, repeating the above steps to laminate metal layers enables one to shape the desired three-dimensional structure.

Note that if the above steps are repeated, it is necessary, before newly spreading the metal powder 204 over the metal layer, to decrease the height of the three-dimensional structure by the thickness of the metal layer, that is, by an increase in the height of the three-dimensional structure. To do this, the three-dimensional shaping apparatus 200 moves the Z-axis stage 206 downward, as indicated by an arrow in FIG. 2, by the thickness of the metal layer. The moving step of the Z-axis stage 206 in a general three-dimensional shaping apparatus is about 100 μm. Therefore, the layer thickness of the spread metal powder 204 is also about 100 μm. The movable range of the Z-axis stage 206, that is, the maximum shaping depth, is several hundred μm.

In the above-described preheating step or melting step, the time taken to preheat or melt the metal powder 204 is inversely proportional to the power of the electron beam 207 applied to a unit area. The power of the electron beam 207 is given by the product of the acceleration voltage and the current of the electron beam 207. The acceleration voltage of the electron beam 207 is the voltage between the cathode 201a and the anode 201b. The acceleration voltage of the electron beam 207 in a general three-dimensional shaping apparatus is several ten kV.

To improve the shaping speed of the three-dimensional shaping apparatus 200, it is necessary to increase the power of the electron beam 207. In a general three-dimensional shaping apparatus, this requirement is met by increasing the current of the electron beam 207. The current of the electron beam 207 is controlled by adjusting the bias voltage of the electron gun 201. The bias voltage is the voltage between the cathode 201a and the grid 201c. The current of the electron beam 207 is also controlled when the electron beam 207 is to be cut off completely to set the current to zero. The control operation of setting the current of the electron beam 207 to zero is executed in a step in which the electron beam 207 is not necessary, such steps including a step of spreading the metal powder 204 over the shaping surface 205 and a step of moving the Z-axis stage 206.

The shaping speed of the three-dimensional shaping apparatus 200 can be increased not only by changing the current of the electron beam 207, as mentioned above, but also by changing the acceleration voltage of the electron beam 207. In this case, however, changes in the acceleration voltage result in unwanted changes in the deflection sensitivity of the deflector 203. Changes in the deflection sensitivity change the maximum deflection area of the electron beam 207, thereby causing inconvenience in the operation of the apparatus. The deflection sensitivity refers to the amount of deflection for a deflection signal of a unit strength.

Changes in the acceleration voltage of the electron beam 207 also change the thickness of the heated regions of the metal powder 204 (the depth to which electrons penetrate from the surface). When the acceleration voltage is several ten kV, the thickness of the heated regions of the metal powder 204 falls within a range of from several μm to several ten μm.

Note that increasing the current of the electron beam 207 as described above is not preferable, however, in terms of the shaping accuracy. This is because the smallest shaping size of the three-dimensional shaping apparatus 200 is determined by the diameter of the electron beam 207, which diameter increases with the increase in the current of the electron beam 207.

For this reason, when the smallest shaping size is to be preferentially decreased, the current of the electron beam 207 is suppressed at the sacrifice of the shaping speed. Out of the preheating step and the melting step, it is the melting step that corresponds to such a case. Here, the reason why the diameter of the electron beam 207 decreases with the decrease in the current of the electron beam 207 is that with the decrease in the current of the electron beam 207, the aperture angle of the electron beam 207 incident on the shaping surface 205 decreases, and this decreases aberrations caused by the lens 202.

As long as the diameter of the electron beam 207 meets the requirements for the smallest shaping size, increasing the shaping speed of the three-dimensional shaping apparatus 200 makes it necessary to increase the current of the electron beam 207 in the melting step, and accordingly increase the scanning speed of the metal powder 204.

In the melting step, when a region where the metal powder 204 is melted is scanned with the electron beam 207, it is necessary, in order to prevent overheating of the region, to increase the scanning speed in the region in proportion to the current of the electron beam 207. If the region is overheated, the evaporation amount of the melted metal powder 204 becomes excessive, and the thickness of the metal layer formed after the metal powder 204 is solidified decreases to a non-negligible level. The decrease of the thickness can be compensated for in the following step of newly spreading the metal powder 204 over the metal layer, but, as a result of the evaporation, the inner wall of the apparatus becomes covered and contaminated by an evaporated metal film. Furthermore, if the evaporated metal film flakes off onto the shaping surface 205, the metal powder 204 at the landing spot becomes prevented from being melted as expected. In addition, the overheating transfers excessive heat to a region where the metal powder 204 is not melted, which region is adjacent to the region where the metal powder 204 is melted, thereby causing unintended melting that can lead to deterioration of the shaping accuracy.

Similarly, when, in the melting step, a region where the metal powder 204 is not melted is scanned with the electron beam 207, it is necessary, in order to prevent unintended melting in the region, to temporarily increase the scanning speed in the region to a value higher than that in the region where the metal powder 204 is melted. That is, it is necessary to set the time for heating the metal powder 204 with the electron beam 207 to be shorter than the time taken to melt the metal powder 204. Here, the scan of the region where the metal powder 204 is not melted is a scan with which to move the electron beam 207 from one region to another region at a high speed when the deflection area of the deflector 203 includes a plurality of discontinuous regions where the metal powder 204 is melted; these regions cannot be scanned continuously without a region where the metal powder 204 is not melted being scanned by the electron beam 207.

In the above operation, the current of the electron beam 207 does not decrease (nor is it cut off) and therefore the electron beam 207 is always incident on somewhere on the shaping surface 205. This is because the voltages for controlling the electron gun 201, that is, the acceleration voltage and bias voltage, are generally as high as several kV to several ten kV, and because it is thus difficult to rapidly decrease the current of the electron beam 207 from a normal value and return the current of the electron beam 207 to the original value. That is, it is easier to deflect the electron beam 207 at high speeds than to change the current of the electron beam 207 at high speeds. Another reason is that, since the current of the electron beam 207 is high enough to melt almost any kind of metal, it is difficult to cut off the electron beam 207 by deflecting the electron beam 207 toward some member (usually metal) within the apparatus and temporarily irradiating the member with the electron beam 207 (see, for example, patent literature 2).

In the above operation, it is necessary to set the scanning speed to be equal to or higher than about twice the scanning speed in the region where the metal powder 204 is melted. That is, when the region where the metal powder 204 is not melted is scanned, the heat applied to the metal powder 204 needs to be about half the heat applied to the metal powder 204 in the region where the metal powder 204 is melted. This is because, melting the metal powder 204 requires not only heat that increases the temperature of the metal powder 204 to the melting point or higher, but also heat that melts the metal powder 204 at the melting point, that is, the melting heat, and because the amount of the melting heat is almost equal to that of the heat required to increase the temperature. In order not to melt the metal powder 204, it is necessary to suppress the melting temperature to a value lower than the melting point of the metal powder 204.

From the magnitude relationship between the scanning speed in the region where the metal powder 204 is melted and that in the region where the metal powder 204 is not melted, it follows that, when the current of the electron beam 207 is increased to increase the shaping speed of the three-dimensional shaping apparatus 200, it is the scanning speed in the region where the metal powder 204 is not melted that can reach the highest scanning speed of the deflector 203. Therefore an attempt to increase the current of the electron beam 207 and the scanning speed in the region where the metal powder 204 is melted so as to increase the shaping speed of the three-dimensional shaping apparatus 200 inevitably results in making it necessary to set the scanning speed in the region to be lower than the highest scanning speed of the deflector 203 and decrease the current of the electron beam 207 accordingly.

That is, the shaping speed of the three-dimensional shaping apparatus 200 is limited by a scanning speed necessary for preventing unintended melting in the region where the metal powder 204 is not melted. Here, the highest scanning speed of the deflector 203 is limited by the electric circuit driving it. Details thereof will be described later.

If the scanning speed in the region where the metal powder 204 is melted is set lower (the current of the electron beam 207 is set smaller) as described above, the time taken for shaping structures becomes longer accordingly. That is, the practical shaping speed of the three-dimensional shaping apparatus 200 becomes lower. This becomes conspicuous when the total area of the regions where the metal powder 204 is not melted is much smaller than that of the regions where the metal powder 204 is melted and thus the scanning speed in the regions where the metal powder 204 is melted significantly influences the practical shaping speed of the three-dimensional shaping apparatus 200.

In other words, the practical shaping speed of the three-dimensional shaping apparatus 200 can be increased somehow by increasing the scanning speed in the region where the metal powder 204 is melted (and increasing the current of the electron beam 207 accordingly). This can be done by increasing the response speed of the deflector 203 as technically high as possible, for example. This also increases the scanning speed in the region where the metal powder 204 is not melted.

Here, note that increasing the response speed as mentioned above should not sacrifice the shaping area, that is, the deflection area of the deflector 203. More specifically, it is desirable to ensure the deflector 203 a deflection area covering a square with a side of at least a several hundred mm, as described above. This is important so as not to limit the maximum size of the structures to be shaped. Furthermore, this can also be important in shaping smaller structures, if they are to be shaped in parallel in the deflection area of the deflector 203, so as not to decrease the practical shaping speed for them.

The reason why the practical shaping speed decreases with the decrease in the deflection area of the deflector 203 is that the shaping speed takes into account non-negligible time taken to perform steps other than the melting step, especially the step of spreading the metal powder 204 over the shaping surface 205. More specifically, the time (several sec per metal layer) taken to perform the step of spreading the metal powder 204 over the shaping surface 205 can become equal to or longer than that (several hundred msec to several sec per metal layer) taken to perform the step of melting and solidifying the metal powder 204. Therefore, for a constant shaping volume, the decrease in the deflection area of the deflector 203 increases the number of times of executing the step of spreading the metal powder 204 over the shaping surface 205, resulting in an increase in the shaping time.

However, it is not easy to increase both the deflection area and response speed of the deflector 203. This is because the deflection area and response speed of the deflector 203 are limited by the electric circuit driving it.

More specifically, increasing the maximum deflection area of the deflector 203 makes it necessary to increase the number of turns of each coil forming the deflector 203, or the current flowing through the coil, or both. However, increasing the number of turns of a coil not only delays its response, but also makes it necessary to increase the rated voltage of the amplifier driving the coil, giving rise to a difficulty of ensuring the amplifier both a high rated voltage and a high operation speed. In addition, increasing the current flowing through the coil increases the heat generated inside the amplifier and thereby affect the accuracy of its current output, which depends on the temperature of the amplifier, giving rise to a difficulty of ensuring the amplifier both a high rated current and a high current accuracy.

The reason why an increase in the number of turns of a coil delays its response is that an increase in the number of turns increases the inductance of the coil and thus decreases the resonance frequency determined by the inductance, the parasitic capacitance of the coil, and the capacitance of the wiring connected to the coil. The reason why an increase in the number of turns of a coil makes it necessary to increase the rated voltage of the amplifier driving the coil is that an increase in the inductance of the coil increases the voltage across the coil.

This embodiment of the present invention, a solution to the problem with the shaping speed, enables one to provide a three-dimensional shaping apparatus which makes it possible to increase the shaping speed by increasing the power of the electron beam 207 and setting the scanning speed in the regions where the metal powder 204 is melted to a value close to the highest scanning speed of the deflector 203, and still prevents unintended melting of the metal powder 204 in the regions where the metal powder 204 is not melted. That is, this embodiment enables one to increase the shaping speed of the three-dimensional shaping apparatus to a value higher than that of a conventional three-dimensional shaping apparatus, while preventing unintended melting in the regions where the metal powder 204 is not melted.

(Three-Dimensional Shaping Apparatus of this Embodiment)

FIG. 3 is a view showing the arrangement of the three-dimensional shaping apparatus according to this embodiment. The three-dimensional shaping apparatus 300 includes an electron gun 201, a lens 202, a main deflector 301, a sub-deflector 302, a Z-axis stage 206, a bias voltage controller 303, a sub-deflection controller 304, and a main deflection controller 305. The three-dimensional shaping apparatus 300 also includes a Z-axis stage controller 306, a central controller 307, and a storage unit 308. The deflection area of the main deflector 301, that is, the shaping area, is a 200-mm square. The movable range of the Z-axis stage 206, that is, the maximum shaping depth, is 200 mm.

The three-dimensional shaping apparatus 300 includes, in addition to the main deflector 301, the sub-deflector 302 as its deflector. Both the main deflector 301 and the sub-deflector 302 are electromagnetic multipole deflectors. The deflection area of the sub-deflector 302 is a 2-mm square, which is much smaller than the deflection area of the main deflector 301.

As shown in FIG. 3, the bias voltage controller 303 is connected to the grid 201c, the sub-deflection controller 304 is connected to the sub-deflector 302, the main deflection controller 305 is connected to the main deflector 301, and the Z-axis stage controller 306 is connected to the Z-axis stage 206. The bias voltage controller 303, sub-deflection controller 304, main deflection controller 305, and Z-axis stage controller 306 are connected to the central controller 307. The storage unit 308 is connected to the central controller 307. The storage unit 308 stores data representing the shapes of three-dimensional structures and data representing the conditions for shaping the structures.

The three-dimensional shaping apparatus 300 spreads the metal powder 204 over a shaping surface 205, and then causes the electron gun 201 to generate an electron beam 207. The three-dimensional shaping apparatus 300 causes the lens 202 to focus the generated electron beam 207, and causes the main deflector 301 to deflect the electron beam 207 to desired positions on the shaping surface 205. Then, with the incident electron beam 207, the metal powder 204 existing at the desired positions is melted and solidified. Next, the three-dimensional shaping apparatus 300 compensates for the increase in the height of the three-dimensional structure as a result of the melting and solidification of the metal powder 204 by moving the Z-axis stage 206 downward.

For the operations of the controllers 303 to 307 during the above operation, the data stored in the storage unit 308 are input to the central controller 307. The central controller 307 controls the bias voltage controller 303, main deflection controller 305, sub-deflection controller 304, and Z-axis stage controller 306, based on the input data. More specifically, the central controller 307 increases or decreases the current of the electron beam 207 by changing the bias voltage via the bias voltage controller 303. The central controller 307 also operates the main deflector 301 via the main deflection controller 305, operates the sub-deflector 302 via the sub-deflection controller 304, and moves the Z-axis stage 206 via the Z-axis stage controller 306 by a necessary moving step. These operations of the three-dimensional shaping apparatus 300 are achieved by adding the operation of the sub-deflector 302 to the basic operation of the three-dimensional shaping apparatus 200 described in the background art.

The number of the poles (the number of coils) forming the main deflector 301 is preferably 8 or 12, but the number of the poles forming the sub-deflector 302 is preferably 4. This is due to the following reasons. Firstly, aberrations caused by deflection of the electron beam 207 becomes sufficiently small if the number of poles of each of the main deflector 301 and sub-deflector 302 is 8 or more, but the aberrations become large if the number of poles is 4. Secondly, the deflection area of the main deflector 301 is large and thus the main deflector 301 tends to generate large aberrations but the deflection area of the sub-deflector 302 is small and thus the sub-deflector 302 hardly generates large aberrations. Thirdly, the main deflector 301 determines the incident position of the electron beam 207 on the shaping surface 205 and thus is required to reduce the resulting aberrations, but the sub-deflector 302 diffuses the electron beam 207, as will be described later, and thus is not required to reduce the resulting aberrations. Theoretically, the number of poles of the sub-deflector 302 may be 8 or more instead of 4, but in this case it is necessary to increase the number of amplifiers to drive the coils.

The main deflector 301 is preferably arranged below the sub-deflector 302, as shown in FIG. 3. This is because if the sub-deflector 302 is arranged below the main deflector 301, the trajectory of the electron beam 207, when the main deflector 301 deflects the electron beam 207, deviates from the central axis of the sub-deflector 302, thereby causing additional aberrations.

Figure 4:
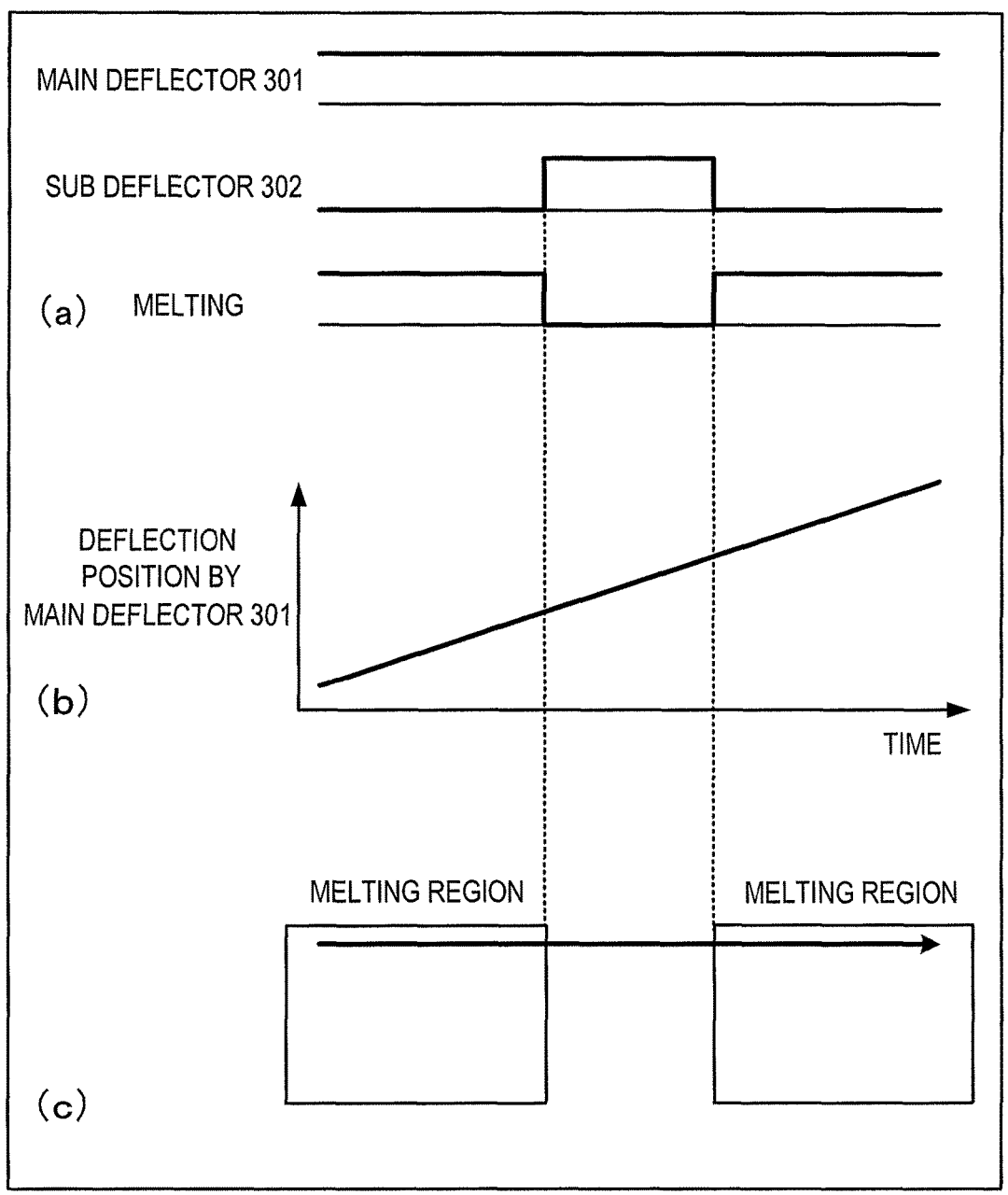
FIG. 4 is a view for explaining the operations of the main deflector and the sub-deflector of the three-dimensional shaping apparatus according to the second embodiment of the present invention.

The operations of the main deflector 301 and sub-deflector 302 of the three-dimensional shaping apparatus 300 are described in detail in the following. FIG. 4 is a view for explaining the operations of the main deflector 301 and sub-deflector 302. In FIG. 4, (a) is a view showing timings at which scanning signals are input to the main deflector 301 and sub-deflector 302 when the main deflector 301 scans the metal powder 204 one-dimensionally, and a timing at which the metal powder 204 is melted within the same period of time. In FIG. 4, (b) is a view showing the relationship between the time and the deflection position determined by the main deflector 301, and (c) is a view showing regions scanned by the main deflector 301. Here, note that the scanning signals refer to signals input to the main deflector 301 and sub-deflector 302 with strength changing rates of nonzero values. That is, if the strength of the deflection signal is nonzero but its strength changing rate is zero, the strength of the scanning signal is zero and the scanning signal input is being stopped. Also note that, during the period from when the scanning signal input to the main deflector 301 stops to when the scanning signal input restarts, the main deflector 301 receives a deflection signal having a strength equal to that of when the scanning signal input stops, but during the corresponding period for the sub-deflector 302, it receives a deflection signal having a strength of zero.

Figure 5:
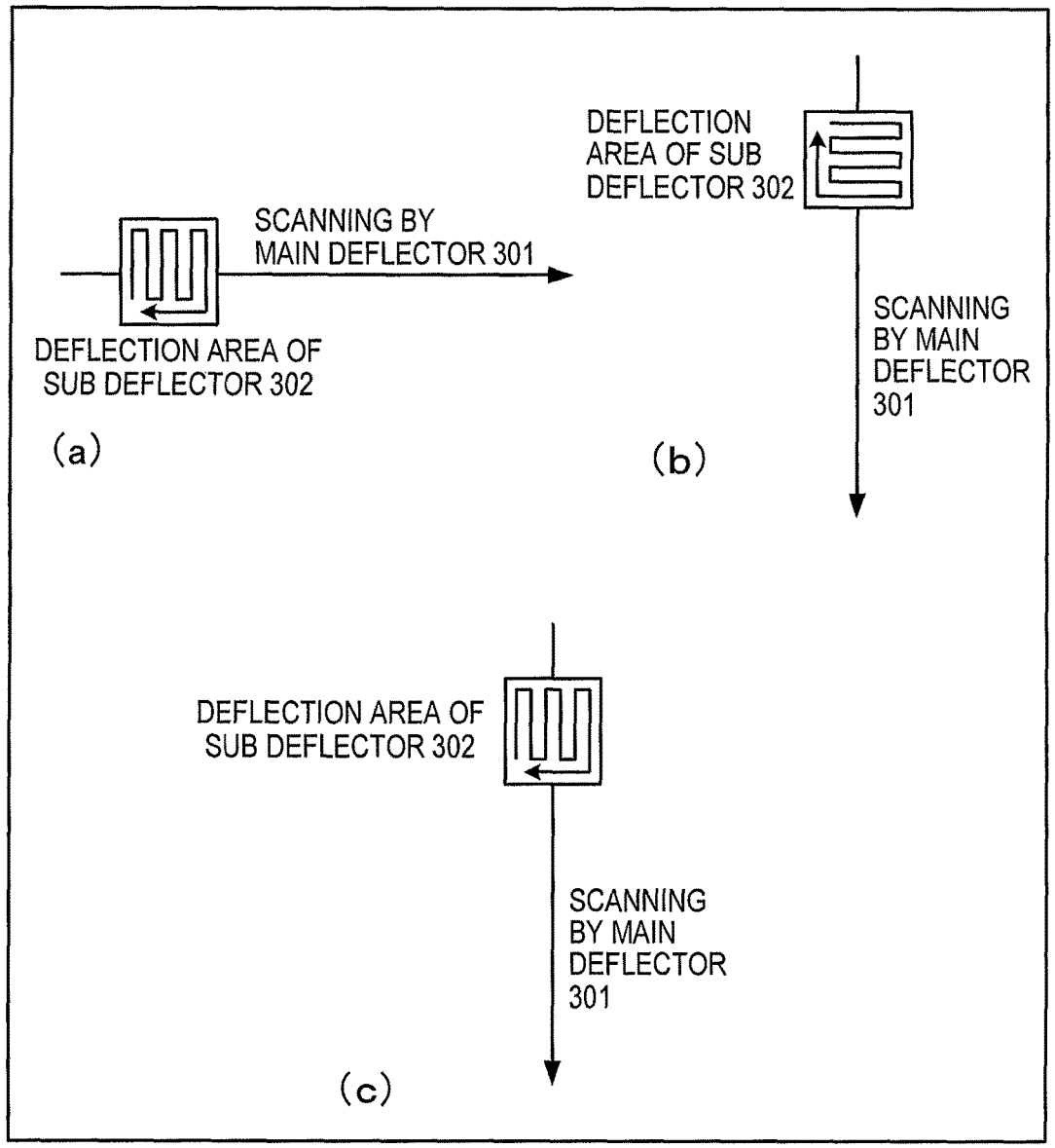
FIG. 5 is a view for explaining scanning by the main deflector and the sub-deflector of the three-dimensional shaping apparatus according to the second embodiment of the present invention.

FIG. 5 is a view for explaining scans by the main deflector 301 and sub-deflector 302. In FIG. 5, (a) is a view for explaining a scan in which the scanning direction of the main deflector 301 is the X direction and the scanning speed of the sub-deflector 302 is higher in the Y direction than in the X direction. In FIG. 5, (b) is a view for explaining a scan in which the scanning direction of the main deflector 301 is the Y direction and the scanning speed of the sub-deflector 302 is higher in the X direction than in the Y direction. In FIG. 5, (c) is a view for explaining a scan in which the scanning direction of the main deflector 301 is the Y direction and the scanning speed of the sub-deflector 302 is higher in the Y direction than in the X direction.

Figure 6:
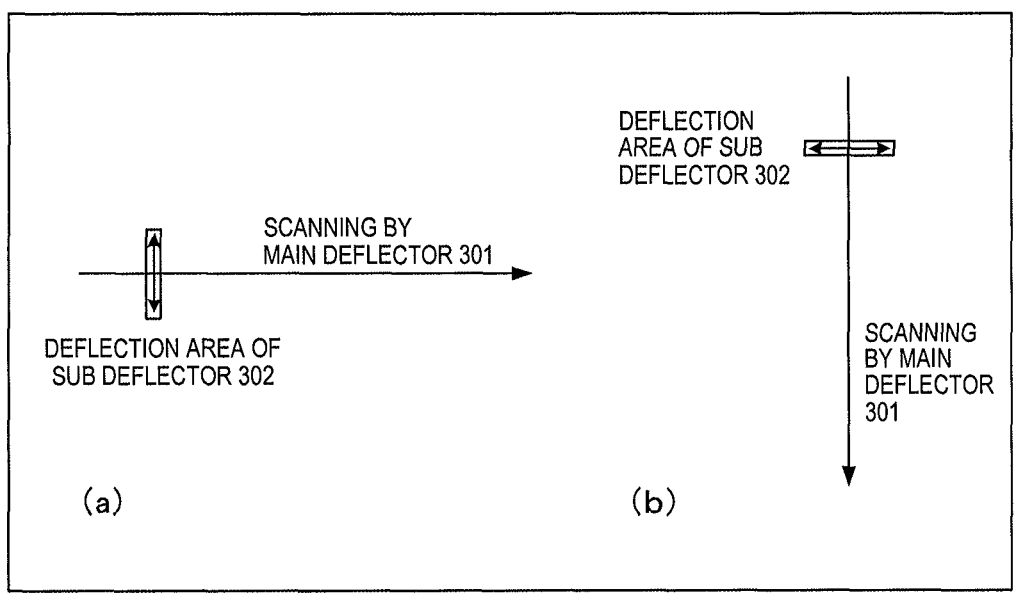
FIG. 6 is a view for explaining scanning by the main deflector and the sub-deflector of the three-dimensional shaping apparatus according to the second embodiment of the present invention.

FIG. 6 is also a view for explaining scans by the main deflector 301 and sub-deflector 302. In FIG. 6, (a) is a view for explaining a scan in which the scanning direction of the main deflector 301 is the X direction and the scanning direction of the sub-deflector 302 is the Y direction. In FIG. 6, (b) is a view for explaining a scan in which the scanning direction of the main deflector 301 is the Y direction and the scanning direction of the sub-deflector 302 is the X direction.

The scans by the main deflector 301 are executed so as to move the electron beam 207 from a region where the metal powder 204 is melted, via a region where the metal powder 204 is not melted, to another region where the metal powder 204 is melted, as shown in (c) of FIG. 4. More specifically, the electron beam 207 is moved after the entire part of the first region where the metal powder 204 is melted is scanned thoroughly, and the direction in which the electron beam 207 is moved is the X direction.

As shown in (a) of FIG. 4, while the main deflector 301 operates, the metal powder 204 which receives the electron beam 207 is heated and then melted. If the sub-deflector 302 operates together with the main deflector 301, however, the heat is diffused. This suppresses the temperature of the metal powder 204 to a value lower than the melting point of the metal powder 204 and, consequently, the metal powder 204 is not melted. That is, the three-dimensional shaping apparatus 300 operates the sub-deflector 302 when moving the electron beam 207 from a region where the metal powder 204 is melted, via a region where the metal powder 204 is not melted, to another region where the metal powder 204 is melted, as shown in (c) of FIG. 4. In other words, it operates the sub-deflector 302 when melting the metal powder 204 in a plurality of discontinuous regions. Here, the scanning speed at which the metal powder 204 is scanned is higher when it is scanned by the sub-deflector 302 than when it is scanned by the main deflector 301.

As shown in (b) of FIG. 4, the scanning speed (the gradient of deflection positions) at which the metal powder 204 is scanned by the main deflector 301 is constant regardless of whether the sub-deflector 302 is operating or not. During its operation, the sub-deflector 302 continuously deflects the electron beam 207, and scans the entire part of the deflection area of the sub-deflector 302 thoroughly at a scanning speed higher than that of the main deflector 301. When the operation of the sub-deflector 302 stops, however, the deflection of the electron beam 207 by the sub-deflector 302 becomes zero and so does the scanning speed of the sub-deflector 302. The purpose of scanning the entire part of the deflection area of the sub-deflector 302 thoroughly is to prevent the distribution of the temperature rise of the metal powder 204, which is heated by the electron beam 207, from being uneven.

The above-described operation assumes that the deflection area of the sub-deflector 302 has a nonzero width in a direction perpendicular to the scanning direction of the main deflector 301, as shown in FIG. 5. That is, the diffusion range of the heat applied to the metal powder 204 is determined by the width of the deflection area of the sub-deflector 302. If this assumption is satisfied, it follows, from a macroscopic point of view, that the scanning speed is not changed but the diameter of the electron beam 207 is larger than it actually is. In this embodiment, the deflection area of the sub-deflector 302 is a 2-mm square, and thus the assumption is satisfied.

More specifically, in this embodiment, the temperature rise of the metal powder 204 is determined by the ratio of the width of the irradiation region of the metal powder 204, which region is extended to the above width, to the diameter of the electron beam 207. This temperature rise can be explained by using numerical examples in the following manner. If the diameter of the electron beam 207 is 0.4 mm and the width of the irradiation region of the metal powder 204, which region is extended to the above width, is 2.4

(=0.4+2.0), for example, the temperature rise of the region, reduced by the deflection by the sub-deflector 302, is simply determined to be ⅙ (=0.4/2.4) of that without it.

In the above operation, if the scanning speed at which the metal powder 204 is scanned by the main deflector 301 is 10 m/s, the scanning speed at which the metal powder 204 is scanned by the sub-deflector 302 is determined to be 360 m/s, that is, 36 (=(2.4/0.4)$^2$) times the scanning speed determined by the main deflector 301. This scanning speed makes it possible to complete the irradiation of the metal powder 204 over the entire part of the deflection area of the sub-deflector 302 within a period of time it takes to complete the irradiation of the metal powder 204 over the cross-sectional area of the electron beam 207. That is, if the sub-deflector 302 operates at this scanning speed, the sub-deflector 302 completes irradiation of a 2.4-mm square every time the scanning distance by the main deflector 301 increases by 0.4 mm. Here, if the scanning direction of the main deflector 301 is the X direction, the scan by the sub-deflector 302 is chosen to be such that the scanning speed is higher in the Y direction than in the X direction, as shown in (a) of FIG. 5. If the scanning direction of the main deflector 301 is the Y direction, however, the scan by the sub-deflector 302 is chosen to be such that the scanning speed is higher in the X direction than in the Y direction, as shown in (b) of FIG. 5.

The scan by the sub-deflector 302 in the above operation can also be such that even if the scanning direction of the main deflector 301 is the Y direction, the scanning speed is higher in the Y direction than in the X direction, as shown in (c) of FIG. 5. This is because the scanning speed of the sub-deflector 302, that is, the scanning speed which enables the irradiation of the metal powder 204 over the entire part of the deflection area of the sub-deflector 302 to be completed within a period of time it takes to complete the irradiation of the metal powder 204 over the cross-sectional area of the electron beam 207, is independent of the scanning direction of the main deflector 301. The scans shown in (a) and (b) of FIG. 5 are different in scanning trajectory from the scan shown in (c) of FIG. 5, but all these scans, in the above case, result in irradiation of the metal powder 204 over the entire width of 2.4 mm.

In the above operation, the main deflector 301 is associated with the shape and position accuracies of the regions where the metal powder 204 is melted, and therefore needs calibration of the shape, rotation, and size of its deflection area and, if necessary, correction of deflection aberrations. The sub-deflector 302, however, need only have a minimum scanning speed and a minimum deflection area necessary for preventing the metal powder 204 from being melted, and therefore does not particularly need calibration of the shape, rotation, and size of its deflection area or correction of deflection aberrations.

In addition, in this embodiment, the deflection area of the sub-deflector 302 is two-dimensional, as shown in FIG. 5, but can also be one-dimensional, as shown in FIG. 6. In this case, as shown in FIG. 6, the deflection direction of the sub-deflector 302 is set to be perpendicular to that of the main deflector 301.

In this case, the scanning speed at which the metal powder 204 is scanned by the sub-deflector 302 can be equal to, or if necessary, lower than the above value of 360 m/s. This is because the magnitude of the deflection area of the sub-deflector 302 is smaller for the one-dimensional deflection than for the two-dimensional deflection, and thus the total scanning distance necessary for scanning the entire part of the deflection area of the sub-deflector 302 thoroughly is shorter for the one-dimensional deflection than for the two-dimensional deflection. Here, the magnitude of the deflection area of the sub-deflector 302 for the one-dimensional deflection is, for the sake of convenience, defined by the product of the deflection width of the sub-deflector 302 and the diameter of the electron beam 207 on the shaping surface 205.

Note that if the scanning speed of the sub-deflector 302 is set too low, the regions to be scanned by the sub-deflector 302 cannot be scanned evenly, and the heat applied to the metal powder 204 is not diffused efficiently. The mechanism by which this problem occurs is similar to that by which an oscilloscope shows the waveform of an alternating electric signal to be one thick line (in a three-dimensional shaping apparatus, heat is diffused with high efficiency) if the frequency of the signal is excessively higher than the sweep frequency of the oscilloscope, but begins to show the waveform to be the original waveform with high fidelity (in a three-dimensional shaping apparatus, heat is diffused with low efficiency) as the frequency of the signal decreases.

Also note that explained above was a case in which the scanning direction of the main deflector 301 is perpendicular to that of the sub-deflector 302, but the angular relationship between the deflections of those deflectors is not limited to this. The scanning direction of the main deflector 301 and that of the sub-deflector 302 can form an arbitrary angle. That is, as long as the deflection area of the sub-deflector 302 has a nonzero width in a direction perpendicular to the scanning direction of the main deflector 301, the scanning direction of the sub-deflector 302 can be an oblique direction.

According to this embodiment, when moving the electron beam 207 from a region where the metal powder 204 is melted, via a region where the metal powder 204 is not melted, to another region where the metal powder 204 is melted, that is, when the metal powder 204 in a plurality of discontinuous regions is melted, operating the sub-deflector 302 prevents melting of the metal powder 204 between the regions where the metal powder 204 is melted, that is, unintended melting of the metal powder 204.

This allows one to increase the power of the electron beam 207 accordingly, and increase the scanning speed of the main deflector 301 in the region where the metal powder 204 is melted to close to the highest scanning speed of the main deflector 301. Here, if the scanning speed of the main deflector 301 in the region where the metal powder 204 is melted reaches the highest scanning speed of the main deflector 301 together with the scanning speed of the main deflector 301 in the region where the metal powder 204 is not melted, the scanning speed at which the metal powder 204 is scanned by the main deflector 301 is always its highest scanning speed, regardless of which regions are being scanned.

That is, introducing the sub-deflector 302 makes it possible, while preventing unintended melting in the regions where the metal powder 204 is not melted, to increase the shaping speed of the three-dimensional shaping apparatus 300 to a value higher than that without the sub-deflector 302. Note that without the sub-deflector 302, the shaping speed of the three-dimensional shaping apparatus 300 is limited by the scanning speed in the regions where the metal powder 204 is not melted, but with the sub-deflector 302, the shaping speed is limited by the scanning speed in the regions where the metal powder 204 is melted, which speed can now reach the highest scanning speed of the main deflector 301. Therefore, with the sub-deflector 302, the shaping speed of the three-dimensional shaping apparatus 300 improves particularly if the total area of the regions where the metal powder 204 is not melted is much smaller than that of the regions where the metal powder 204 is melted, and if thus the scanning speed in the regions where the metal powder 204 is melted influences the practical shaping speed of the three-dimensional shaping apparatus 300 significantly.

[Third Embodiment]

Figure 7:
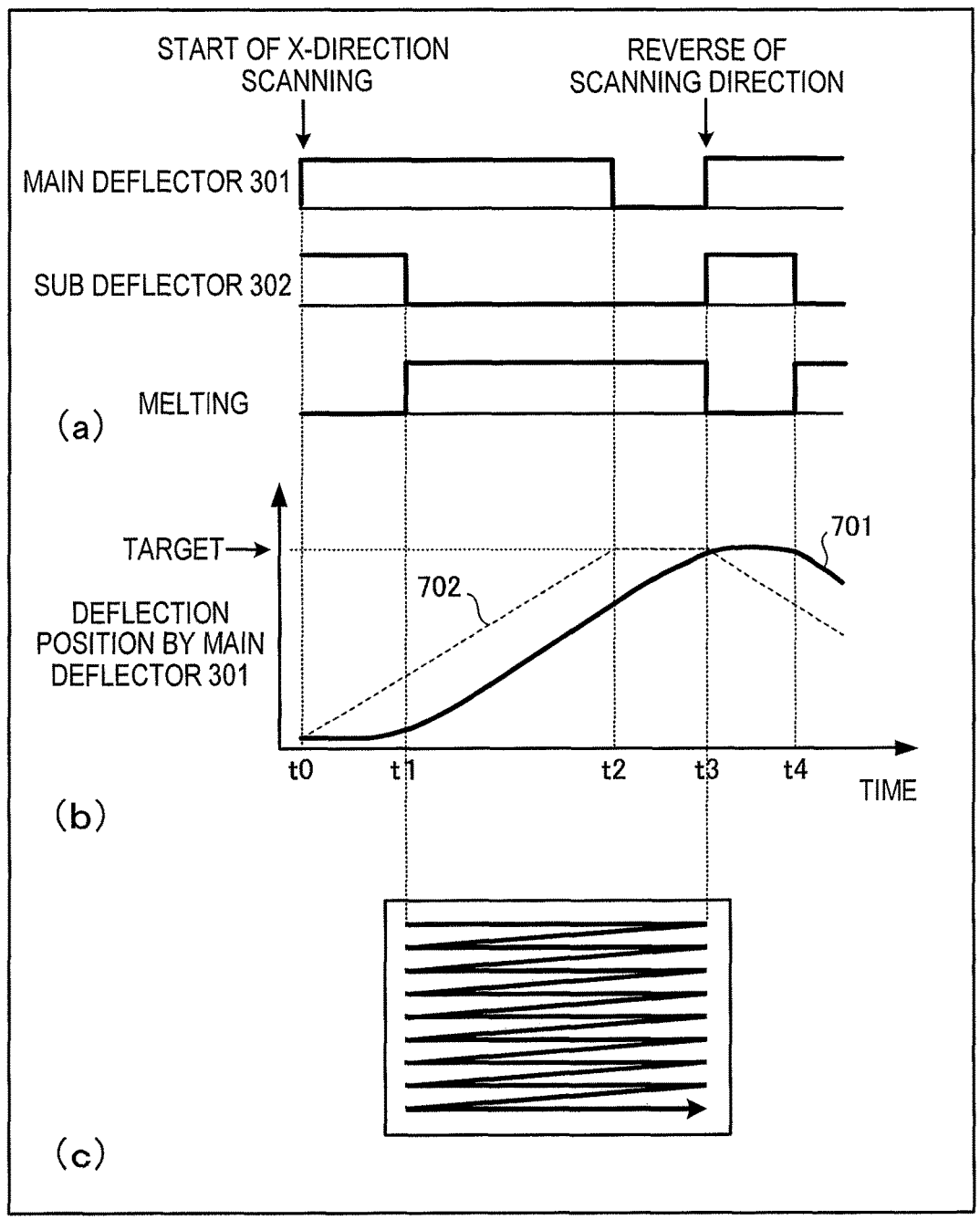
FIG. 7 is a view for explaining an overview of the operation of a three-dimensional shaping apparatus according to the third embodiment of the present invention.

A three-dimensional shaping apparatus according to the third embodiment of the present invention will be described with reference to FIG. 7. FIG. 7 is a view for explaining an overview of the operation of the three-dimensional shaping apparatus according to this embodiment. The three-dimensional shaping apparatus according to this embodiment is different from the three-dimensional shaping apparatus 300 according to the second embodiment in that the sub-deflector 302 is operated immediately after the scanning signal input to the main deflector 301 starts or restarts. The other components and operations are the same as those in the second embodiment and are denoted by the same reference numerals, and detailed descriptions thereof will be omitted.

In FIG. 7, (a) is a view showing timings at which scanning signals are input to the main deflector 301 and sub-deflector 302, and a timing at which the metal powder 204 is melted. In FIG. 7, (b) is a view showing the deflection position determined by the main deflector 301 and (c) is a view showing a region scanned by the main deflector 301.

The basic operation according to this embodiment is the same as that in the second embodiment. The difference is that the sub-deflector 302 is operated, so as to diffuse the heat applied to: the metal powder 204 which receives the electron beam 207 and thereby suppress the resulting temperature rise, during a period during which, immediately after the scanning signal input to the main deflector 301 starts or restarts, the scanning speed of the main deflector 301 is temporarily lower than a desired scanning speed.

The operations of the main deflector 301 and sub-deflector 302 according to this embodiment are described in detail in the following. In FIG. 7, (a) shows timings at which scanning signals are input to the main deflector 301 and sub-deflector 302 when the main deflector 301 raster-scans the metal powder 204, and a timing at which the metal powder 204 is melted within the same period of time. In FIG. 7, furthermore, (b) shows the relationship between the time and the deflection position determined by the main deflector 301, and (c) shows a region scanned by the main deflector 301. This scan is for a region where the metal powder 204 is melted, as shown in (c) of FIG. 7. More specifically, the scan is a repetition of a high-speed reciprocating scan in the X direction, the trajectory of which scan is shifted by a small step in the Y direction. Note that (a) and (b) of FIG. 7 show only a fragment of the scan over the entire part of the region shown in (c) of FIG. 7 and, more specifically, they show the process, during a given time period, of scanning a part of the region from left to right in the X direction and then reversing the scanning direction.

In (b) of FIG. 7, the solid line 701 indicates the relationship between the time and the actual deflection position X of the electron beam 207, and the broken line 702 indicates the relationship between the time and the ideal deflection position X of the electron beam 207. Before time t0, the scanning signal input to the main deflector 301 is off but the scanning signal input to the sub-deflector 302 is on. At time t0, the scanning signal input to the main deflector 301 is turned on, and the X-direction scan by the main deflector 301 starts. After that, at time t1, the scanning signal input to the sub-deflector 302 is turned off to start melting of the metal powder 204. At time t2, the scanning signal input to the main deflector 301 is turned off. At time t3, the scanning signal input to the sub-deflector 302 is turned on to end the melting. Furthermore, at time t4, the X-direction scanning signal input is turned on again, and the X-direction scan by the main deflector 301 restarts, but at this time point it is given a reversed scanning signal to reverse the scanning direction.

As shown in (b) of FIG. 7, after the X-direction scan by the main deflector 301 starts, that is, after the X-direction scanning signal input to the main deflector 301 starts (from time t0 to time t1), the deflection position (solid line 701) determined by the main deflector 301 is delayed with respect to the ideal deflection position (broken line 702). As a result, the deflection by the main deflector 301 continues even after the scanning signal input to the main deflector 301 is stopped (from time t2 to time t3) for a period equal to the above delay time, and finally the deflection position converges to the target position.

From the scanning speed of the main deflector 301 in the above-described operation, it follows that, after the scanning signal input to the main deflector 301 starts (from time t0 to time t1), the scanning speed (the gradient of the solid line 701) of the main deflector 301 is lower than the ideal scanning speed (the gradient of the broken line 702), as shown in (b) of FIG. 7. The scanning speed of the main deflector 301 is also low after the series of processes of stopping the scanning signal input to the main deflector 301, letting the deflection by the main deflector 301 continue, and restarting the scanning signal (from time t3 to time t4).

While the scanning speed of the main deflector 301 is low, the metal powder 204 which receives the electron beam 207 is overheated. This overheating causes unintended melting, thereby degrading the shaping accuracy. The overheating, furthermore, increases the evaporation amount of the metal powder 204 excessively, and thereby decreases the thickness of the metal layer formed after the metal powder 204 is solidified to a non-negligible level. The decrease can be compensated for in the following step of newly spreading the metal powder 204 over the solidified metal layer but, with the increase in the evaporation amount of the metal powder 204, the rate at which the thickness of an evaporated metal film formed on the inner wall of the apparatus increases becomes more rapid. Then the speed at which the inner wall of the apparatus becomes contaminated increases, and the evaporated metal film flakes off more easily. If the evaporated metal film flakes off onto the shaping surface 205, the metal powder 204 at the landing spot becomes prevented from being melted as expected.

To cope with this, as shown in (a) of FIG. 7, the sub-deflector 302 is operated immediately after the scanning signal input to the main deflector 301 starts or restarts. Then the sub-deflector 302 diffuses the heat applied to the metal powder 204 which receives the electron beam 207, and suppresses the overheating of the metal powder 204, thereby preventing the above-described problem from arising. Note that in this embodiment, the sub-deflector 302 thoroughly scans the entire part of its deflection area, as in the second embodiment.

According to this embodiment, it is possible to prevent the metal powder 204 which receives the electron beam 207, immediately after the scanning signal input to the main deflector 301 starts or restarts, from being overheated, and thus prevent unintended melting that can lead to degradation of shaping accuracy.

Added to the above explanations is that in the above-described operation, the process of temporarily stopping the scanning signal input to the main deflector 301 so as to let the deflection position converge to the target position before the scanning direction of the main deflector 301 is reversed can also be performed effectively when its scanning direction is not changed but its scanning speed is changed. This process, in both cases, improves the position accuracy of the boundaries of the regions where the metal powder 204 is melted or the regions where the metal powder 204 is not melted, thereby improving the shaping accuracy.

In this embodiment, the sub-deflector 302 is operated immediately after the scanning signal input to the main deflector 301 starts or restarts, as described above, but the timing at which the sub-deflector 302 is operated is not limited to this. For example, for a case in which the scanning speed of the main deflector 301 reaches a predetermined scanning speed, and then becomes lower than the predetermined scanning speed, the sub-deflector 302 can be operated effectively until the scanning speed of the main deflector 301 returns to the predetermined scanning speed.

[Fourth Embodiment]

A three-dimensional shaping apparatus according to the fourth embodiment of the present invention will be described with reference to FIG. 8. FIG. 8 is a view showing the arrangement of the three-dimensional shaping apparatus according to this embodiment. In the three-dimensional shaping apparatus 800 according to this embodiment, the position of the sub-deflector 302 is different from that in the three-dimensional shaping apparatus 300 according to the second embodiment. The other components and operations are the same as those in the second embodiment and are denoted by the same reference numerals, and detailed descriptions thereof will be omitted.

In the three-dimensional shaping apparatus 800, the sub-deflector 302 is arranged between the electron gun 201 and the lens 202. That is, the lens 202 is sandwiched between the main deflector 301 and the sub-deflector 302. Note that the main deflector 301 is provided closer to the shaping surface 205 than the lens 202, and the sub-deflector 302 is provided closer to the electron gun 201 than the main deflector 301. This is because the main deflector 301 determines the incident position of the electron beam 207 on the shaping surface 205 and is thus required to suppress resulting aberrations but the sub-deflector 302 is only required to diffuse the electron beam 207 and is not required to reduce aberrations. If the main deflector 301 or sub-deflector 302 is provided closer to the electron gun 201 than the lens 202, the trajectory of the electron beam 207 deviates from the central axis of the lens 202 as a result of the deflection of the electron beam 207, thereby causing additional aberrations.

If the sub-deflector 302 is provided above the lens 202, the lens 202 rotates the trajectory of the electron beam 207 deflected by the sub-deflector 302. Therefore, the sub-deflector 302 is preferably rotated according to the above rotation of the trajectory. According to this embodiment, it is possible to improve the speed of shaping three-dimensional structures, as according to the second embodiment.

[Fifth Embodiment]

A three-dimensional shaping apparatus according to the fifth embodiment of the present invention will be described with reference to FIG. 9. FIG. 9 is a view showing the arrangement of the three-dimensional shaping apparatus according to this embodiment. The three-dimensional shaping apparatus 900 according to this embodiment is different from the three-dimensional shaping apparatus 300 according to the second embodiment in that two lenses are included. The other components and operations are the same as those in the second embodiment and are denoted by the same reference numerals, and detailed descriptions thereof will be omitted. The three-dimensional shaping apparatus 900 includes two lenses 202 and 901 between the electron gun 201 and the sub-deflector 302. Even if there are a plurality of lenses as described above, the main deflector 301 is provided closer to the shaping surface 205 than the lenses.

According to this embodiment, it is possible to improve the speed of shaping three-dimensional structures, as according to the second embodiment. Furthermore, it is possible to change the aperture angle of the electron beam 207 on the shaping surface 205, and thereby adjust the diameter of the electron beam 207 on the shaping surface 205. Note that described above was a case in which the number of lenses is two, but the number of lenses in this embodiment is not limited to this. As long as layout restrictions are met, the number of lenses can be three or more.

[Sixth Embodiment]

The sixth embodiment provides a three-dimensional shaping apparatus having basically the same arrangement as that of the three-dimensional shaping apparatus 300 according to the second embodiment. The three-dimensional shaping apparatus 300 has one main deflector 301, but the three-dimensional shaping apparatus according to this embodiment has two main deflectors. FIG. 10 is a view showing the arrangement of the three-dimensional shaping apparatus 1000 according to this embodiment.

As is apparent from FIG. 10, the three-dimensional shaping apparatus 1000 includes, in addition to the main deflector 301, the main deflector 301' as a main deflector. The main deflector 301' is an electromagnetic multipole deflector, as with the main deflector 301. The shape of the deflection area of the main deflector 301' is a square.

In the three-dimensional shaping apparatus 1000, the deflection areas of the main deflectors 301 and 301' and the sub-deflector 302 are 200, 20, and 2-mm squares, respectively. That is, the deflection area of the main deflector 301 is the largest, the deflection area of the main deflector 301' is the second largest, and the deflection area of the sub-deflector 302 is the smallest.

The three-dimensional shaping apparatus 1000 also includes the main deflection controller 305'. The main deflection controller 305' is connected to the main deflector 301' and the central controller 307.

In this embodiment, the basic operation is the same as that in the second embodiment, but with the operation of the main deflector 301' added. The central controller 307 controls the main deflector 301' via the main deflection controller 305'.

The roles of the main deflectors 301 and 301' and the sub-deflector 302 according to this embodiment will now be briefly explained. The main deflector 301 moves the deflection area of the main deflector 301' within the deflection area of the main deflector 301 itself. The main deflector 301' scans the regions where the metal powder 204 is melted or the regions where the metal powder 204 is not melted within the deflection area of the main deflector 301' itself. The sub-deflector 302 diffuses the heat applied to the metal powder 204 in the regions where the metal powder 204 is not melted. Note that even in the regions where the metal powder 204 is melted, the sub-deflector 302 operates while, after the scanning signal input to the main deflector 301 or 301' starts or restarts, the scanning speed is temporarily lower than a desired scanning speed. This operation of the sub-deflector 302 is the same as that in the third embodiment.

Figure 11:
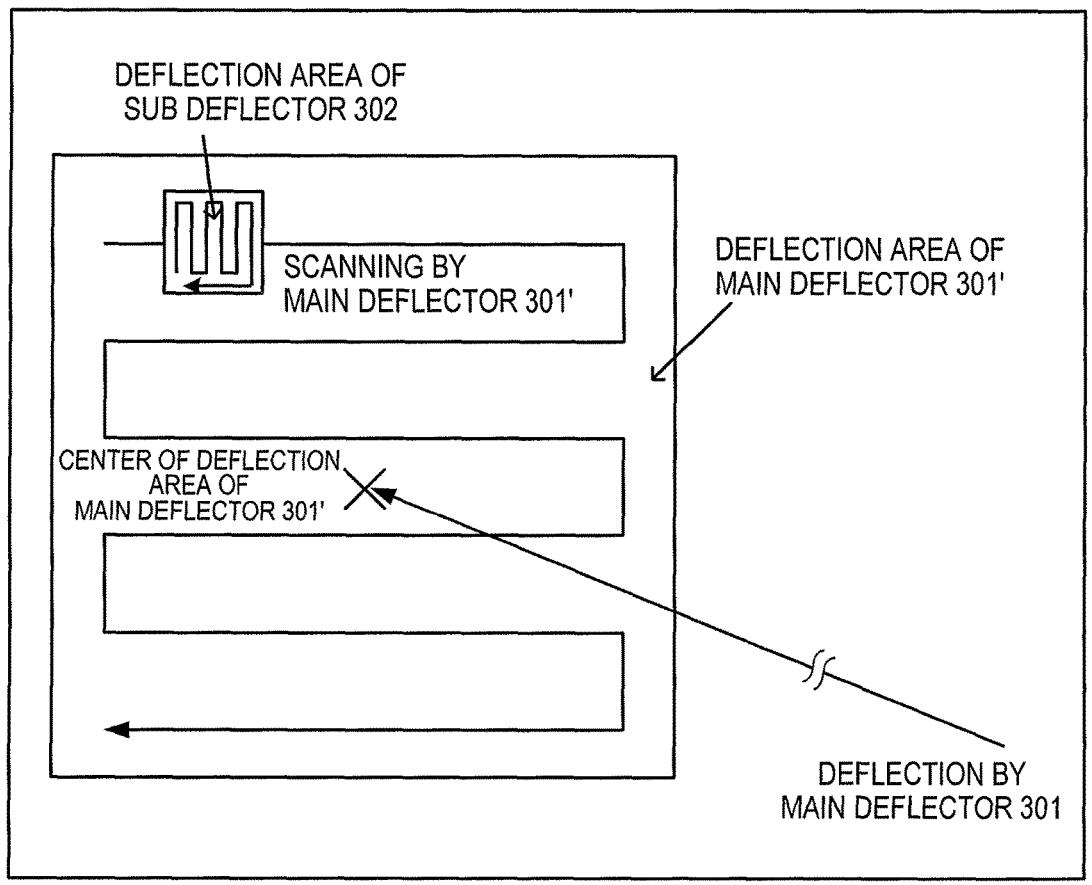
FIG. 11 is a view for explaining scanning by the main deflector and the sub-deflector of the three-dimensional shaping apparatus according to the sixth embodiment of the present invention.

FIG. 11 shows the deflection by the main deflector 301, the deflection area of the main deflector 301', the scan by the main deflector 301', and the scan by the sub-deflector 302 according to this embodiment.

In the above operation, the scanning speeds of the main deflectors 301 and 301' and the sub-deflector 302 are 10, 10, and 360 m/s, respectively. That is, the scanning speed of the sub-deflector 302 is higher than those of the main deflectors 301 and 301', and the scanning speed of the main deflector 301 is equal to that of the main deflector 301'.

If, as described above, the deflection area of the main deflector 301' is made smaller than that of the main deflector 301, it is possible to decrease the inductance of each coil forming the main deflector 301' and thereby increase its response speed. That is, it is possible to shorten the duration time during which the scanning speed of the main deflector 301' is temporarily lower than the desired scanning speed. The duration time during which the scanning speed of the main deflector 301' is temporarily low, that is, the duration time during which the sub-deflector 302 operates, corresponds to the duration time during which the metal powder 204 is not melted. Therefore, if the duration time is shortened, the shaping speed improves.

The degree of the improvement becomes conspicuous as the deflection area of the main deflector 301' becomes larger as long as the response speed of the main deflector 301' is not too low. This is because the increase in the deflection area of the main deflector 301' may not change the duration time during which the scanning speed of the main deflector 301 is temporarily lower than the desired scanning time, but decreases the number of times the duration time appears.

For the above reason, in this embodiment, it is possible not only to, by introducing the sub-deflector 302, increase the shaping speed while preventing unintended melting in the regions where the metal powder 204 is not melted, as in the second embodiment, but also to, by introducing the main deflector 301', further increase the shaping speed.

Figure 12:
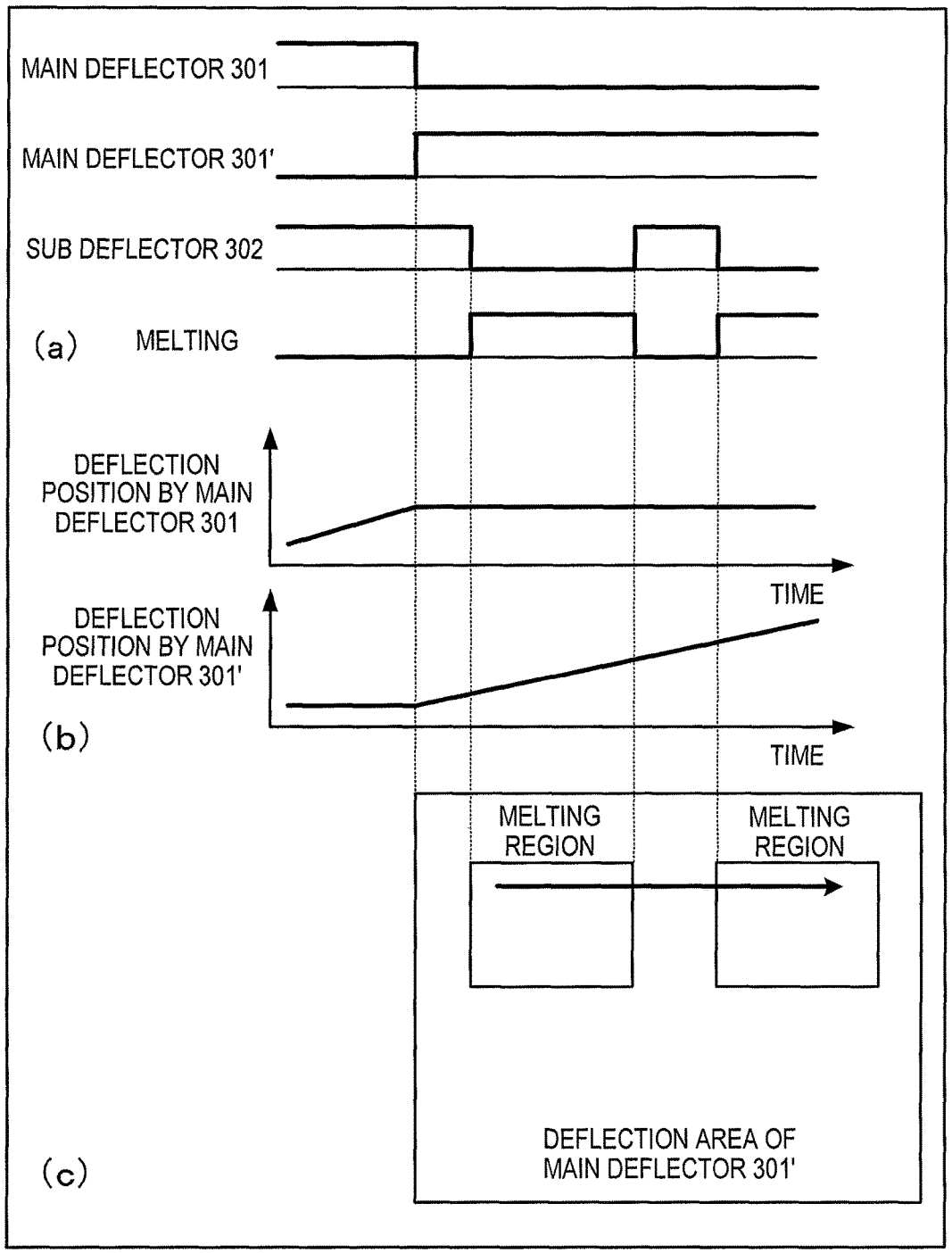
FIG. 12 is a view for explaining an overview of the operation of the three-dimensional shaping apparatus according to the sixth embodiment of the present invention.

The following explains the time-course of the operations of the main deflectors 301 and 301' and the sub-deflector 302 according to this embodiment. In FIG. 12, (a) shows timings at which the scanning signals are input to the main deflectors 301 and 301' and the sub-deflector 302 in the series of operations of causing the main deflector 301 to move the deflection area of the main deflector 301' and causing the main deflector 301' to scan the metal powder 204 one-dimensionally (in the X direction), and a timing at which the metal powder 204 is melted in the same series of operations. In FIG. 12, furthermore, (b) shows the relationship between the time and the deflection position determined by the main deflector 301 and the relationship between the time and the deflection position determined by the main deflector 301', and (c) shows part of the regions scanned by the main deflector 301'.

As is apparent from (c) of FIG. 12, the scan is such that the electron beam 207 is moved from a region where the metal powder 204 is melted, via a region where the metal powder 204 is not melted, to another region where the metal powder 204 is melted. More specifically, the electron beam 207 is moved after the entire part of the first region where the metal powder 204 is melted is scanned thoroughly, and the direction in which the electron beam 207 is moved is the X direction.

For the sake of simplicity, FIG. 12 does not reflect the fact that, after the scanning signal inputs start, the scanning speeds are temporarily lower than the desired speeds. In other words, for the sake of convenience, assume that the response speeds of the main deflectors 301 and 301' are very high.

As is apparent from (a) of FIG. 12, in the series of operations, the main deflector 301' does not operate while the main deflector 301 moves the deflection area of the main deflector 301', but, after the completion of the movement, scans the regions (having a side of 24 mm or less) where the metal powder 204 is melted and the regions where the metal powder 204 is not melted, within the deflection area of the main deflector 301' itself. Here, the purpose of scanning the regions where the metal powder 204 is not melted is to move the electron beam 207 from the region where the metal powder 204 is melted, via the region where the metal powder 204 is not melted, to another region where the metal powder 204 is melted, as described in the second embodiment.

Added to the above explanations is that, in the above-described series of operations, while the main deflector 301 moves the deflection area of the main deflector 301', the main deflector 301' does not operate, but in fact it may be necessary to operate the main deflector 301' during the same period of time. This is because the deflection coordinate (coordinates defined within the deflection area) corresponding to the end position of the scan by the main deflector 301' immediately before the start of the movement of the deflection area is generally different from that corresponding to the start position of the scan by the main deflector 301' immediately after the completion of the movement of the deflection area, and because it is thus necessary, while the deflection area is moved, to deflect the electron beam 207 to the deflection coordinate corresponding to the start position.

In contrast, the sub-deflector 302, in the above-described series of operations, scans the entire part of its own deflection area thoroughly while the regions where the metal powder 204 is not melted are scanned by either of the main deflectors 301 and 301', as is apparent from (a) of FIG. 12. Here, as described in the second embodiment, the scanning area of the sub-deflector 302 can be not only two-dimensional but also one-dimensional.

As described above, according to this embodiment, it is possible not only to, by using the sub-deflector 302, increase the shaping speed while preventing unintended melting in the regions where the metal powder 204 is not melted, as according to the second embodiment, but also to, by using the main deflector 301', further increase the shaping speed.

Added to the above explanations is that, although the number of the main deflectors used in this embodiment was set to two, it can be three or more. Suppose there are provided three main deflectors, for example, and let them be referred to as the main deflectors 301, 301', and 301", they can be used so that the main deflector 301 moves the deflection area of the main deflector 301', the main deflector 301' moves the deflection area of the main deflector 301", and the main deflector 301" scans, within its deflection area, the regions where the metal powder 204 is melted or the regions where the metal powder 204 is not melted, and then the sub-deflector 302 diffuses heat applied to the metal powder 204 in the region where the metal powder 204 is not melted.

[Other Embodiments]

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The present invention is applicable to a system including a plurality of devices or a single apparatus. The present invention is also applicable even when an information processing program for implementing the functions of the embodiments is supplied to the system or apparatus directly or from a remote site. Hence, the present invention also incorporates the program installed in a computer to implement the functions of the present invention on the computer, a medium storing the program, and a WWW (World Wide Web) server that causes a user to download the program. The present invention specifically incorporates at least a non-transitory computer readable medium storing a program for causing the computer to execute the processing steps included in the above-described embodiments.

The invention claimed is:

1. A three-dimensional shaping apparatus comprising:
an electron gun that generates an electron beam;
at least one first deflector that deflects the electron beam one-dimensionally or two-dimensionally;
at least one electromagnetic lens that is arranged between said electron gun and said at least one first deflector, and that focuses the electron beam;
a second deflector that is arranged between said electron gun and said at least one first deflector, and that deflects the electron beam one-dimensionally or two-dimensionally; and
a controller that controls deflection directions of said at least one first deflector and said second deflector so that the deflection directions of said at least one first deflector and said second deflector are different from each other, and that causes only said at least one first deflector only to deflect the electron beam when scanning with the electron beam a region where powder is to be melted to shape three-dimensional objects, and that causes both said at least one first deflector and said second deflector to deflect the electron beam when scanning with the electron beam a region where the powder is not to be melted,
wherein when the electron beam scans a region where the powder is not to be melted, said controller widens an area irradiated in a unit of time by the electron beam in comparison with an area irradiated in a unit of time by the electron beam when said second deflector is not caused to deflect, so as to prevent unintended melting of the powder in the region where the powder is not to be melted.

2. The three-dimensional shaping apparatus according to claim 1, wherein said controller further controls the scanning speeds of said at least one first deflector and said second deflector so that the scanning speed of said second deflector is higher than the scanning speed of said at least one first deflector.

3. The three-dimensional shaping apparatus according to claim 1, wherein said second deflector is provided between said electron gun and said electromagnetic lens.

4. The three-dimensional shaping apparatus according to claim 1, wherein said second deflector is provided between said electromagnetic lens and said at least one first deflector.

5. The three-dimensional shaping apparatus according to claim 1, wherein said controller controls the deflection directions of said at least one first deflector and said second deflector so that the deflection direction of said at least one first deflector and the deflection direction of said second deflector are perpendicular to each other.

6. The three-dimensional shaping apparatus according to claim 1, wherein when the electron beam scans a region where the powder is to be melted, said controller further causes said second deflector to deflect the electron beam while the scanning speed of said at least one first deflector does not reach a predetermined scanning speed, and thereby diffuses heat given by the electron beam to the powder while the scanning speed of said at least one first deflector does not reach a predetermined scanning speed, the heat being diffused over the width of the deflection area of said second deflector, so as to prevent overheating of the powder in the region where the powder is to be melted.

7. A control method of a three-dimensional shaping apparatus, the three-dimensional shaping apparatus comprising:
an electron gun that generates an electron beam;
at least one first deflector that deflects the electron beam one-dimensionally or two-dimensionally;
at least one electromagnetic lens that is provided between said electron gun and said at least one first deflector, and that focuses the electron beam;
a second deflector that is provided between said electron gun and said at least one first deflector, and that deflects the electron beam one-dimensionally or two-dimensionally; and
a controller that controls the deflection directions of said at least one first deflector and said second deflector,
the control method comprising:
generating the electron beam with said electron gun;
focusing the electron beam with said electromagnetic lens;
deflecting the electron beam one-dimensionally or two-dimensionally with said at least one first deflector and said second deflector;
controlling the deflection directions of said at least one first deflector and said second deflector so that the deflection directions of said at least one first deflector and said second deflector are different from each other;
causing only said at least one first deflector to deflect the electron beam when scanning with the electron beam a region where powder is to be melted to shape three-dimensional objects; and
causing both said at least one first deflector and said second deflector to deflect the electron beam when scanning with the electron beam a region where the powder is not to be melted;
the control method thereby diffusing heat given by the electron beam to the powder when the electron beam scans a region where the powder is not to be melted, the heat being diffused over the width of the deflection area of said second deflector, so as to prevent unintended melting of the powder in the region where the powder is not to be melted.

8. A non-transitory computer-readable medium storing a control program of a three-dimensional shaping apparatus, the three-dimensional shaping apparatus comprising:
an electron gun that generates an electron beam;
at least one first deflector that deflects the electron beam one-dimensionally or two-dimensionally;
at least one electromagnetic lens that is provided between said electron gun and said at least one first deflector, and that focuses the electron beam;
a second deflector that is provided between said electron gun and said at least one first deflector, and that deflects the electron beam one-dimensionally or two-dimensionally; and
a controller that controls the deflection directions and scanning speeds of said at least one first deflector and said second deflector,
the control program causing a computer to execute a control method comprising:
generating the electron beam with said electron gun;
focusing the electron beam with said electromagnetic lens;
deflecting the electron beam one-dimensionally or two-dimensionally with said at least one first deflector and said second deflector;

controlling the deflection directions of said at least one first deflector and said second deflector so that the deflection directions of said at least one first deflector and said second deflector are different from each other;

causing only said at least one first deflector to deflect the electron beam when scanning with the electron beam a region where powder is to be melted to shape three-dimensional objects; and causing both said at least one first deflector and said second deflector to deflect the electron beam when scanning with the electron beam a region where the powder is not to be melted, the control method thereby diffusing heat given by the electron beam to the powder when the electron beam scans a region where the powder is not to be melted, the heat being diffused over the width of the deflection area of said second deflector, so as to prevent unintended melting of the powder in the region where the powder is not to be melted.

* * * * *